(12) United States Patent
Scott

(10) Patent No.: US 6,509,276 B2
(45) Date of Patent: *Jan. 21, 2003

(54) FOCUSED ION BEAM ETCHING OF COPPER WITH VARIABLE PIXEL SPACING

(75) Inventor: Dane L. Scott, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/125,107

(22) Filed: Apr. 18, 2002

(65) Prior Publication Data

US 2002/0151182 A1 Oct. 17, 2002

Related U.S. Application Data

(63) Continuation of application No. 09/608,116, filed on Jun. 30, 2000, now Pat. No. 6,407,001.

(51) Int. Cl.[7] .............................................. H01L 21/00
(52) U.S. Cl. ......................... 438/712; 216/66; 216/78; 438/720; 438/742
(58) Field of Search ................................. 438/690, 691, 438/707, 712, 720, 742; 216/66, 78

(56) References Cited

U.S. PATENT DOCUMENTS

| 4,243,476 A | 1/1981 | Ahn et al. |
| 4,490,211 A | 12/1984 | Chen et al. |
| 4,838,994 A | 6/1989 | Gulde et al. |
| 5,958,799 A | 9/1999 | Russell et al. |
| 6,322,672 B1 | 11/2001 | Shuman et al. |
| 6,407,001 B1 * | 6/2002 | Scott ........................ 438/712 |
| 2001/0027917 A1 | 10/2001 | Ferranti et al. |
| 2001/0053605 A1 | 12/2001 | Phaneuf et al. |

OTHER PUBLICATIONS

J. Robert Lineback, "FEI Develops Circuit Editing Tool for Copper ICs", *Semiconductor Business News*, Jun. 19, 2000.

* cited by examiner

*Primary Examiner*—William A. Powell
(74) *Attorney, Agent, or Firm*—Blakely, Sokoloff, Taylor & Zafman LLP

(57) ABSTRACT

A method including introducing a focused ion beam to a metal material on a substrate within a processing chamber and etching the metal material with variable pixel spacing.

29 Claims, 2 Drawing Sheets

FOCUSED ION BEAM ETCHING OF COPPER WITH VARIABLE PIXEL SPACING

RELATED APPLICATIONS

This application is a continuation of, and claims priority from, U.S. patent application Ser. No. 09/608,116 filed Jun. 30, 2000, now U.S. Pat. No. 6,407,001.

BACKGROUND OF THE INVENTION

1. Field of the Invention

The invention relates to removal of metal material in integrated circuit devices, particularly removal of discrete portions of interconnect material.

2. Background

Integrated circuit structures are generally formed of hundreds or thousands of discrete devices on a semiconductor chip such as a silicon semiconductor chip. The individual devices are interconnected in appropriate patterns to one another and to external devices through the use of interconnection lines or interconnects to form an integrated device. Typically, many integrated circuit devices are formed on a single structure, such as a wafer substrate and, once formed, are singulated into individual chips or dies for use in various environments.

In the prior art, the predominant material for interconnect structures has been aluminum or an aluminum alloy. The material is generally introduced in the form of a deposition process, e.g., chemical vapor deposition (CVD), and patterned by way of an etching process. A typical aluminum interconnect patterning process, also referred to as an etching process, involves introducing a halogen species such as chlorine or bromine in the presence of oxygen and possibly a focused ion beam to interact with the interconnect material and selectively remove material. Patterning in this way allows typically lines of interconnect to be routed between devices in desired patterns.

In the context of forming improved integrated circuit chips or dies, researchers have recognized the benefit of copper or its alloys as an improved interconnect material. Copper and its alloys present unique challenges with respect to patterning. Copper, unlike aluminum, is not readily susceptible to a chemical etching processes. One solution to this patterning challenge has been met by Damascene processing in terms of introducing a copper interconnect according to a desired pattern. Once introduced, however, Damascene processing does not offer a technique for re-routing or modifying the introduction material.

In the context of forming integrated circuit dies or chips, the devices of such dies or chips are generally tested in a variety of ways prior to release or sale. In a typical process, an integrated circuit design is configured into a blueprint which is copied by complex machinery into a physical structure. Once defined, the physical structure is simulated prior to marketing. Due to pushing technology limits, simulation are generally not fully sufficient to represent actual product performance. Based on this reality, a physical structure of an original design product is fabricated (FAB) and the product enters a debug cycle.

During a product debug cycle, the integrated circuit product is tested against original design intent in an effort to correct any logical or speed test issues that are realized following FAB initial release. Debug laboratory tools are designed to reduce the debug cycle times as much as possible because a direct relationship exists between the debug cycle time and time-to-market.

One unique challenge to a debug laboratory seeking to evaluate and quite possibly modify or re-route copper-based interconnect routing, is that the existing tool set is not designed or configured to pattern (e.g., etch) copper material. What is needed is a process and tool that allows for such modification or re-routing of copper interconnect.

DETAILED DESCRIPTION OF THE DRAWINGS

The features, aspects, and advantages of the invention will become more thoroughly apparent from the following detailed description, appended claims, and accompanying drawings in which:

DETAILED DESCRIPTION OF THE INVENTION

Figure 1:
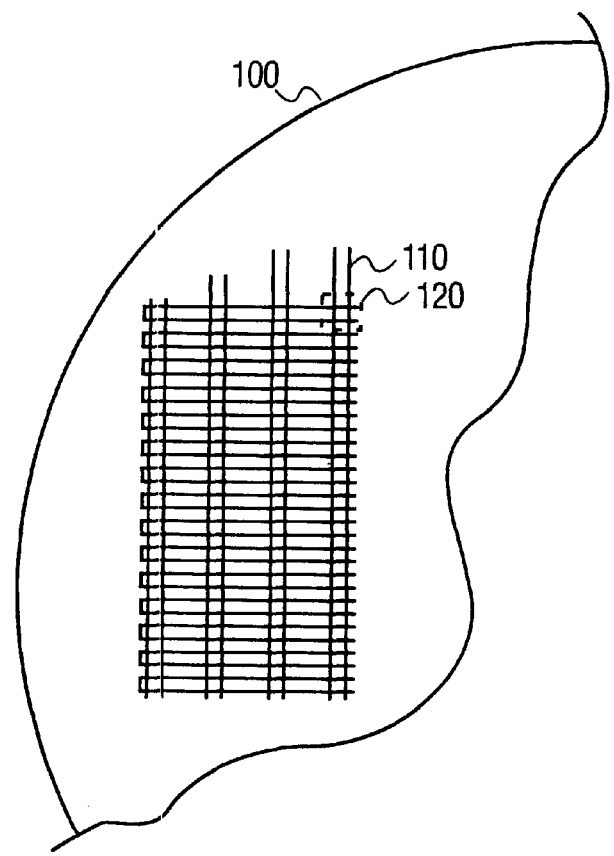
FIG. 1 is a schematic planar top view of a portion of a wafer showing a plurality of interconnect lines covering a portion of the wafer.

A method is disclosed. In one embodiment, the method includes introducing a focused ion beam (FIB) and an interactive species to a metal material on a substrate within a processing chamber and etching the metal material. One example describes a suitable interactive species as including an oxygen source gas and together with the FIB, the oxygen source gas is introduced to a copper interconnect material to etch the copper material. In the context of the description of the invention, the word copper is intended to refer to both pure copper and copper alloys that are suitable as integrated circuit interconnect material.

In another aspect, a system for modifying a signal line such as an interconnect on a substrate is disclosed. In one embodiment, the system includes a chamber configured to house a substrate, such as a semiconductor wafer or discrete chip or die, an energy source, and a gas source. A system controller is configured to control the introduction of a gas from the gas source into the chamber and to control the introduction of an FIB from the energy source. A memory coupled to the controller includes a machine-readable medium having a machine-readable program embodied therein for directing operation of the system. The machine-readable program includes instructions for controlling the gas source and the energy source to introduce the FIB and the gas source into the chamber concurrently to interact with an exposed signal line or interconnect on the substrate. In this manner, for example, the patterning (e.g., modifying or re-routing) of copper interconnect or signal line material may be accomplished similar to its aluminum interconnect counterpart.

One application of both the system and the method of the invention is in the context of integrated circuit testing, including testing as part of a debug cycle. According to the method of the invention, copper interconnects or signal lines may be modified to, for example, re-route or terminate an interconnect or signal line to a device structure such as a transistor device, a bond pad, or another interconnect. The system of the invention describes a suitable tool for accomplishing such a modification in the context of a debug operation.

In one aspect, the invention relies on a focused ion beam (FIB) to pattern metal material such as an interconnect or signal line. In the context of integrated circuit testing, a FIB tool is a debug tool used to implement logic and speed cap circuit modification, prior to making a decision regarding possible fabrication modifications at the FAB level. Successful circuit modifications reduce the risk of introducing unforeseen problems during subsequent tape out and raises the confidence level regarding product performance as FAB implements high volume manufacturing activity. A FIB tool has been used in the past to pattern aluminum lines in conjunction with chlorine or bromine chemistry injected onto an exposed aluminum surface. As noted above, however, this method has not been successfully incorporated into patterning copper material.

FIG. 1 is a schematic representation of a portion of typical semiconductor wafer or substrate. Referring to FIG. 1, wafer 100 includes a plurality of interconnects or signal lines formed over the surface of substrate 100 and coupled to, in one case, discrete devices, such as transistors, capacitors, etc., formed in or on wafer 100. In a typical state of art integrated circuit chip or die, there may be as many as five different levels of interconnects or signal lines, generally stacked one on top of another and isolated from one another by dielectric material. Dielectric material, such as silicon nitride ($Si_3N_4$) and possibly a polyimide material, is typically formed over the ultimate interconnect or signal line level to isolate and insulate the ultimate level of the external environment. Links to various interconnect or signal line levels and the devices themselves to external signals is typically accomplished through the use of bond pads either surrounding the chip or die or covering a surface of the chip or die. In the context of the description of the invention, FIG. 1 shows a portion of the interconnects or signal lines exposed in a schematic fashion (in this case, penultimate interconnect or signal line 110 and ultimate interconnect or signal line 120), exposed in a sense that layers of dielectric material are not shown. In no sense, are the visible interconnects or signal lines drawn to scale with wafer 100, as it is to be appreciated that such a scaled representation would make a visual representation of the wafer and certain interconnects or signal lines difficult due to the small size of the interconnects or signal lines. FIG. 1 also does not show corresponding bond pads that may provide external signals to interconnects or signal lines 110 and 120 or devices to which they connect.

Figure 2:
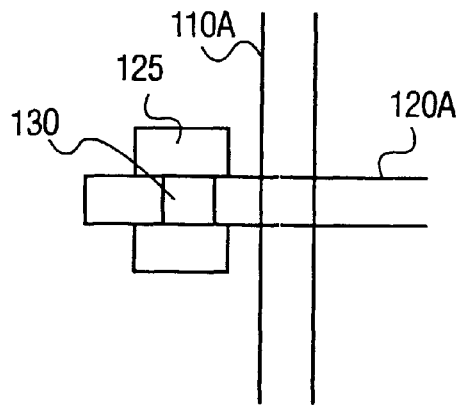
FIG. 2 is a magnified view of two interconnect lines showing one line coupled through a via to a device in or on the substrate.

FIG. 2 shows a magnified view of a portion of the substrate 100 as illustrated in FIG. 1. FIG. 2 shows two interconnects or signal lines, interconnect or signal line 110A and interconnect or signal line 120A intersecting at an angle of approximately 90 degrees. FIG. 2 also schematically shows area 130 of interconnect 120A that serves to connect, for example, interconnect or signal line 120A to underlying device 125 on substrate 100. Device 125 is, for example, a transistor, capacitor, or other device, with interconnect or signal line 120A coupled, for example in the case of a transistor, possibly by way of a via to a gate or junction of the device as typically configured.

Figure 3:
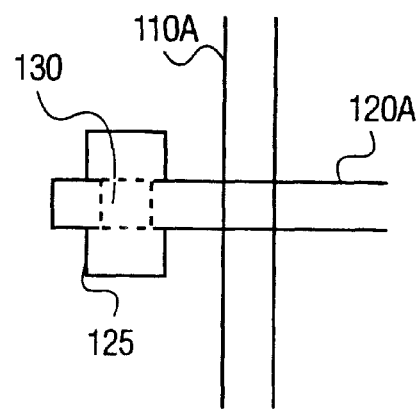
FIG. 3 shows the structure of FIG. 2 after removing a portion of the interconnect material associated with the one line at the point of connection to the device in accordance with one embodiment of the invention.

FIG. 3 shows the device of FIG. 2 after removing the connection of interconnect or signal line 120A to device 125. In this example, a portion of interconnect or signal line 120A, represented by area 130, is removed to eliminate the connection of interconnect or signal line 120A to device 125. In one embodiment, interconnect or signal line 120A is a copper interconnect or signal line. To successfully pattern (in this case, etch or remove) interconnect or signal line 120A in area 130, a combination of an FIB and an interactive species is introduced over the interconnect or signal line. A suitable FIB is, for example, created from a gallium source and the gallium ions produced in the beam are used, it is believed, to break up the copper material at area 130. The disrupted copper material then, in one embodiment, interacts with an interactive species and is drawn away from area 130 without or with minimal disrupted copper material remaining.

In one embodiment, the interactive species includes oxygen supplied by an oxygen source gas, such as pure oxygen, or a gas with an oxygen species (nitrogen oxide, nitrous oxide, water, etc.). Another suitable interactive species is xenon fluoride. It is to be appreciated that, in the context of this embodiment of the invention, interaction of the interactive species includes where the interactive species actually reacts with the disrupted copper material, associates or combines with the disrupted copper material, or simply carries away the disrupted copper material. In another embodiment, the interactive species is introduced in the context of a two-stage process, wherein a first species, such as oxygen is introduced with the FIB and a second species, such as xenon fluoride, is then introduced to remove any residual copper material following the patterning.

Combining an interactive species of oxygen with a FIB offers patterning selectivity advantages. In patterning an interconnect such as described in FIGS. 1–3 where copper interconnect overlies dielectric material (e.g., $SiO_2$), the use of oxygen offers an inhibitive advantage toward etching the dielectric. "Inhibitive," in this context, means that the etching progress with FIB and oxygen occurs at a decelerated rate, four times slower for dielectric and two times slower for copper than a FIB alone. The amount of work being done is generally described in terms of "dose". Dose is the rate of beam energy applied in nano-coulombs per square micron ("$nC/\mu m^2$"). Etching or milling on dielectric material at a dose of 5 $nC/\mu m^2$ to a given depth (or volume of material removed) without oxygen, translates to a dose of more than 20 $nC/\mu m^2$ to achieve the same depth with oxygen. One goal of etching copper in integrated circuit environments is to remove copper while leaving the surrounding dielectric material intact as much as possible. Adjusting the parameters in this case so that the beam is twice as effective as etching copper over dielectric yields a selectivity advantage.

Figure 4:
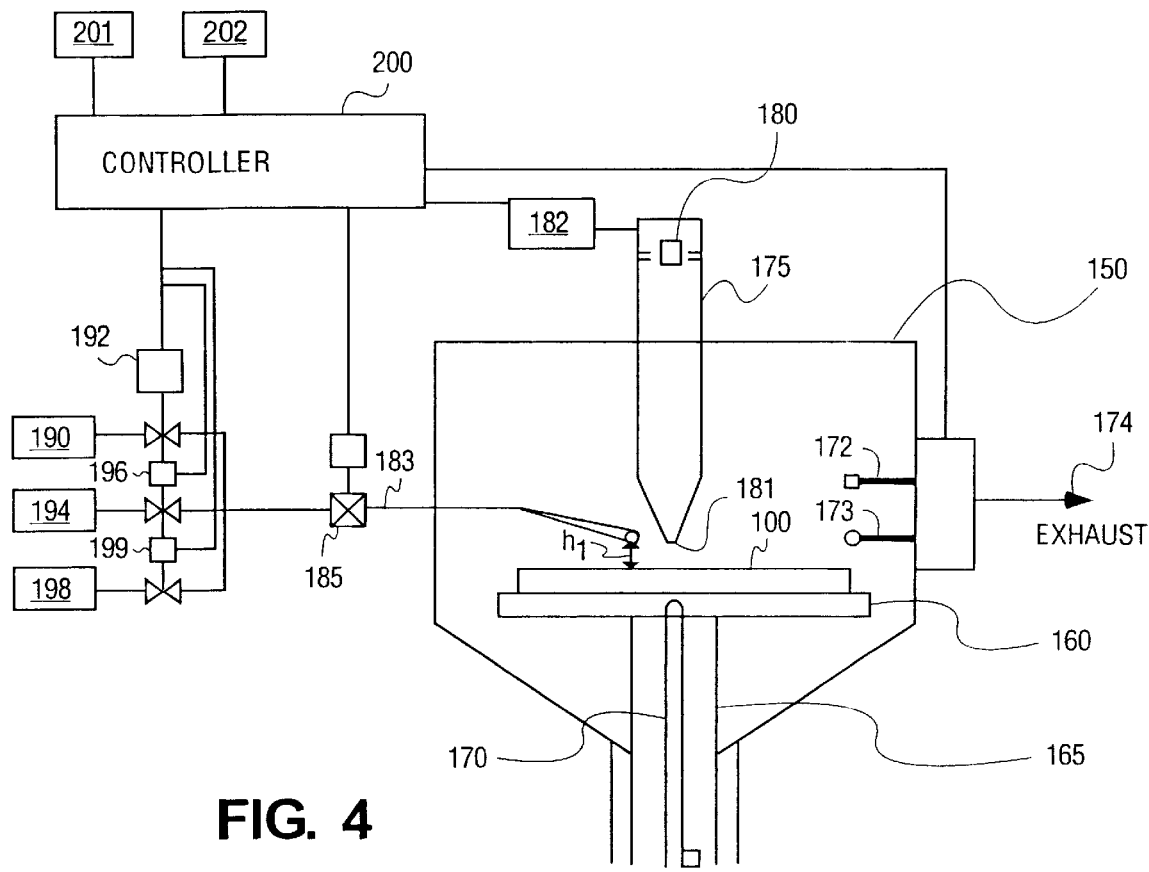
FIG. 4 shows a schematic cross-sectional side view of a processing chamber suitable for performing the modification described in reference to FIG. 3 in accordance with one embodiment of the invention.

FIG. 4 is a schematic view of a suitable apparatus for carrying out a patterning, including etching, modifying, or re-routing, of interconnect material, particularly copper interconnect material. FIG. 4 shows chamber 150, typically constructed of aluminum or steel and having a suitable inside volume to house a substrate, such as wafer 100. In FIG. 4, wafer 100 is seated on wafer processing stage 160 that itself is coupled to shaft 165 to support stage 160 inside the chamber. A heat source, such as a thermocouple and/or other suitable heat source is included to heat the chamber according to a temperature established and monitored by controller 200. In the embodiment illustrates, thermocouple 170 is located within shaft 165.

Still referring to FIG. 4, also attached to chamber 150 is pressure regulator 172 and vacuum source 173. Pressure regulator 172 monitors the pressure of the volume inside chamber 150 and provides this information to controller

200. Controller 200 controls vacuum source 173 to maintain a desired pressure within chamber 150. In this embodiment, the desired pressure in chamber 150 is maintained by introducing gases into chamber 150 and exhausting gases through exhaust 174.

Process gas enters the otherwise sealed chamber volume through gas distribution port 183, in this case, at one side of chamber 150. In one aspect, there may be several process gases associated with chamber 150 that can be introduced into chamber 150 at any one time. The process gases may be used, for example, to introduce species onto substrate 100, such as dielectric material, or to introduce gases in the chamber 150 as part of the patterning process. FIG. 4 shows individual source gases 190, 194, and 198 coupled to a manifold with valves 192, 196, and 199, respectively, controlling their entry. Each valve is coupled to controller 200 to control the entry of source gas into chamber 150. Referring to FIG. 4, FIB column 175 is coupled to chamber 150 and enters through a top surface of the otherwise sealed chamber. FIB column 175 includes chemical delivery system 180 for introducing a species, including but not limited to a gallium species, and energy source 182 (e.g., 50 kV HV power supply) for ionizing the species and delivering the species to the substrate. The amount of species (FIB species) introduced is also regulated by aperture(s) 181 at the base of FIB column 175.

In one embodiment, FIB column 175 is a Micrion 9800FC column produced by FEI Corporation of Hillsboro, Oreg. (www.feico.com). It is to be appreciated that other FIB columns may be similarly suitable.

In the embodiment where an FIB tool is used in conjunction with an oxygen source gas, and the FIB tool comprises a gallium species to etch or define copper material in accordance with an embodiment of the invention, the parameters are set as follows.

For a 0.75 micron thick copper interconnect isolated from devices or another interconnect line beneath it by dielectric material having a thickness of approximately 0.35 microns, an acceleration voltage or energy source for FIB column 175 in the range of 30–50 kilovolts (kV) is suitable. In one example, the beam characteristics of 50 kV for a Micrion 9800FC are 569 picoamps (pA) with a pixel spacing of 0.025 microns by 0.025 microns. A chamber pressure of $1 \times 10^{-5}$ is established. An oxygen source gas of, for example, oxygen gas delivered from source gas 190 through nozzle 183 is positioned approximately 10–1000 microns ($h_1$ of 10–1000 microns), and in one embodiment about 100 microns from the surface of substrate 100.

Figure 5:
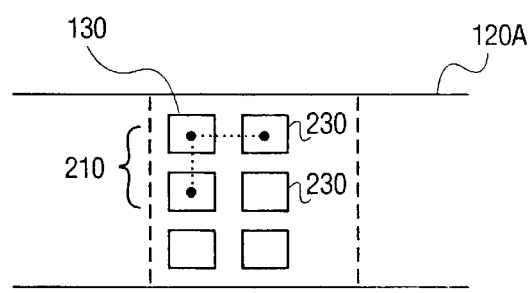
FIG. 5 shows a magnified view of the interconnect lines illustrated in FIG. 3 and the pixel spacing of a focused ion beam on the interconnect.

In etching copper with an FIB tool, the pixel spacing of the FIB on the copper material is noted. In one example, for a 0.25 microns width copper interconnect material, a pixel spacing on the order of approximately 0.025 microns by 0.025 microns is suitable. FIG. 5 shows a magnified view of interconnect line 120A and illustrates pixel spacing over area 130. In FIG. 5, pixel area 230 represents portions of area 130 contacted by the FIB. The dimensions of pixel area 230 are determined by, in large part, aperture(s) 181 of FIB column 175. As illustrated in FIG. 5, each pixel area 230 represents an area contacted by the FIB separated by pixel spacing 210 of, in one example, about 0.025 microns from the center of another pixel area.

As illustrated in FIG. 5, to etch in area 130, the FIB tool is directed at discrete pixel areas 230 within area 130. Thus, the duration of interaction between the FIB is in contact with copper interconnect material (referred to as a dwell time) is of note. A suitable dwell time for a 0.025 micron by 0.025 micron pixel area 230 is in the range of 0.5 to 5 microseconds to etch a 0.75 micron thick copper interconnect material over a dielectric material without significant damage to the adjacent dielectric material. Following the dwell time, the FIB is moved to a second pixel area 230 within area 130. Controller 200 may control the movement (e.g., pixel spacing) of FIB column. Alternatively, wafer 100 itself may be moved to etch a second area or pixel within area 130.

By combining the interaction between a focused ion beam and copper material to discrete pixel areas within an interconnect area (area 130), damage to the underlying structure, such as an underlying dielectric, may be avoided. It is to be appreciated that a copper interconnect material is typically made up of many grains in random orientations. By controlling the pixel spacing within an area of copper material to be removed or etched, a distinct etch definition may be obtained regardless of the grain or the orientation. Thus, at this time, given the tools available, it is desired to etch an area such as an interconnect or signal line having a width on the order of approximately 0.25 microns or greater by distinct pixel areas or smaller areas within a large area. It is to be appreciated, however, that with a suitable FIB tool, an entire interconnect area may be etched at once.

As noted above, in one example, an oxygen source gas is combined with a FIB to achieve a desired etch of copper material. The amount of oxygen delivered to a chamber to achieve the desired etch characteristics is determined by the chamber pressure and the source gas. In one embodiment, noted above, the chamber pressure is maintained at approximately $1 \times 10^{-5}$ Torr for an oxygen source gas of oxygen gas. The pressure can range from $10^{-5}$ Torr to, in one example, $10^{-4}$ Torr. The oxygen supplied from oxygen source gas 190 and delivered through nozzle 183 is directed at an area adjacent the focused ion beam to achieve the interaction between oxygen and the disrupted copper material. Thus, as noted above with respect to FIG. 4, nozzle 183 should be positioned ($h_1$) about 10–1000 microns from the surface of substrate 100 and, in one embodiment, adjacent FIB aperture 181. FIG. 4 shows joint 185 controlled by controller 200 to position nozzle 183. It is to be appreciated that absent automated process control, nozzle 183 may be positioned manually.

The following tables present representative beam parameters for a Micrion 9800FC FIB tool to etch copper with an interactive species of oxygen. Table 1 presents representative beam parameters for making line cuts in copper, while Table 2 presents representative beam parameters for etching bulk quantities.

In making line cuts in copper, the beam parameters represented in Table 1 are designed to provide cut progress visibility for a given field of view (FOV). Table 1 lists the representative column apertures and corresponding beam current, the pixel spacing of a beam in an XY plane, and the dwell time of the beam on copper. The FIB diameter (or spot size) follows from the operation of the Micrion 9800FC FIB tool. The virtual beam parameters ("Vaperture") represent parameters that include modifications (e.g., modified column lens voltage) to reduce the beam current for a given column aperture.

TABLE 1

Parameters for Making Line Cuts in Copper

| Aperture, Current | FIB Diameter (μm) | X Pix (μm) | Y Pix (μm) | Dwell (μsec) |
|---|---|---|---|---|
| 350 μm, 19.7 nA | 0.4 | 0.05 | 0.05 | 0.2 |
| 200 μm, 4761 pA | 0.2 | 0.05 | 0.05 | 0.2 |
| 150 μm, 2070 pA | 0.15 | 0.05 | 0.05 | 0.2 |
| V150 μm, 1000 pA | 0.15 | 0.05 | 0.05 | 0.2 |
| 100 μm, 569 pA | 0.06 | 0.025 | 0.025 | 0.2 |
| V100 μm, 400 pA | 0.06 | 0.025 | 0.025 | 0.2 |
| 75 μm, 209 pA | 0.04 | 0.025 | 0.025 | 0.2 |
| V75 μm, 100 pA | 0.04 | 0.025 | 0.025 | 0.2 |
| 60 μm, 91.8 pA | 0.03 | 0.025 | 0.025 | 0.2 |
| 50 μm, 45.4 pA | 0.02 | 0.025 | 0.025 | 0.2 |

TABLE 2

Parameters for Bulk Etching

| Aperture | FIB Diameter (μm) | X Pix (μm) | V Pix (μm) | Dwell (μsec) |
|---|---|---|---|---|
| 350 μm, 19.7 InA | 0.4 | 0.5 | 0.5 | 0.5 |
| 200 μm, 4761 pA | 0.2 | 0.5 | 0.5 | 0.5 |
| 150 μm, 2070 pA | 0.15 | 0.33 | 0.33 | 0.5 |
| V150 μm, 1000 pA | 0.15 | 0.25 | 0.25 | 0.5 |
| 100 μm, 569 pA | 0.06 | 0.25 | 0.25 | 0.5 |
| V100 μm, 400 pA | 0.06 | 0.25 | 0.25 | 0.5 |
| 75 μm, 209 pA | 0.04 | 0.025 | 0.025 | 0.5 |
| V75 μm, 100 pA | 0.04 | 0.01 | 0.01 | 10 |
| 60 μm, 91.8 pA | 0.03 | 0.01 | 0.01 | 10 |
| 50 μm, 45.4 pA | 0.02 | 0.01 | 0.01 | 10 |

In one embodiment, the invention contemplates removal of copper material, such as the copper interconnect, by a FIB. In another embodiment, the FIB is combined with oxygen, the FIB disrupting the copper material in the area desired for removal and the oxygen interacting with the disrupted copper to draw the disrupted copper material away from the area to be etched. In another embodiment, to possibly maintain an environment free of disrupted copper species, a second interactive species, such as xenon fluoride, may be introduced, for example, through xenon fluoride source gas 198 in chamber 150 following the introduction of oxygen source gas 190. Xenon fluoride is particularly suitable for removing disrupted copper material that may become embedded in dielectric material adjacent the interconnect material where the etching is taking place. In still another embodiment, the invention contemplates etching the copper material by FIB and following such etch with xenon fluoride to remove the disrupted copper material. Following any of the etching processes described, substrate 100 may be removed from the chamber and cleaned by way of, for example, rinsing to remove any undesired residual copper material fragments.

In the embodiment described in FIG. 4, the individual components associated with chamber 150 are coupled to controller 200. Controller 200 controls, for example, the pressure and temperature in the chamber as well as the introduction of FIB column 175 and any desired source gas. In one embodiment, controller 200 comprises processor 201 and memory 202. Memory 202 includes instruction logic accessible by processor 201 to control the patterning (in this case, etching or modifying) occurring within chamber 150. Memory 202 also includes desired set points, such as temperature, pressure, pixel spacing, source gas flow rate, etc., to assist the instruction logic and controller 200 in the patterning of copper material on substrate 100 in chamber 150. In one embodiment, controller 200 is coupled to a user interface to allow a user to enter desired set points for a particular etching operation. It is to be appreciated that, although the operation illustrated in FIG. 4 has been described in terms of an automated process, the invention is not limited to such a process. The invention recognizes the etching of copper with a FIB. It is to be appreciated, that such etching may be done manually as well as through the use of a process controller.

According to the above embodiment, a process and a system for etching metal material, particularly copper, is described. Such etching may be used to, as illustrated, eliminate a portion of an interconnect or signal line to a device on a substrate. Alternatively, such etching may be used in conjunction with a re-configuring tool to reconfigure an interconnect or signal line, for example, re-routing an interconnect or signal line from a first point (e.g., a first device) to a second point (e.g., a second device). Other re-routing or re-configuring techniques that are practiced in a debug process are also suitable. Further, although the invention has been described with reference to a debug process where an interconnect or signal line is formed on a chip with one established path that is altered by the method and system of the invention, the invention may also find use in patterning copper material in the fabrication of the chip. Further, it is to be appreciated that the invention is described with respect to copper material. The method and system of the invention, however, may find use with respect to other materials as an effective way of modifying such material.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:

introducing a focused ion beam, having a diameter, to a first surface point on a material comprising copper on a substrate within a processing chamber; and etching the metal material.

2. The method of claim 1 further comprising introducing the focused ion beam to a second surface point, the second surface point and the first surface point defining a pixel spacing that is greater than the diameter of the focused ion beam.

3. The method of claim 2 further comprising introducing an interactive species to at least the first surface point.

4. The method of claim 2, wherein the pixel spacing is less than the diameter of the focused ion beam.

5. The method of claim 3, wherein the interactive species comprises an oxygen source gas.

6. The method of claim 3, wherein the interactive species comprises xenon difluoride.

7. The method of claim 3, wherein the focused ion beam comprises gallium.

8. The method of claim 5, wherein the oxygen source gas comprises oxygen gas.

9. The method of claim 3, wherein introducing the interactive species comprises introducing the interactive species at a chamber pressure of about $10^{-5}$ Torr.

10. A method comprising:

introducing into a chamber comprising a substrate a focused ion beam, having a diameter, to a first surface point on a copper material on the substrate; and etching the copper material.

11. The method of claim 10 further comprising introducing the focused ion beam to a second surface point, the second surface point and the first surface point defining a pixel spacing that is greater than the diameter of the focused ion beam.

12. The method of claim 11 wherein the pixel spacing is less than the diameter of the focused ion beam.

13. The method of claim 11 further comprising introducing an interactive species to at least the first surface point.

14. The method of claim 13 wherein the interactive species comprises an oxygen source gas.

15. The method of claim 14 wherein the interactive species comprises xenon difluoride.

16. The method of claim 14, wherein the oxygen source gas comprises oxygen gas.

17. The method of claim 13, wherein introducing the interactive species comprises introducing the interactive species at a chamber pressure of about $10^{-5}$ Torr.

18. A system for modifying a signal line on a substrate, comprising:

a chamber configured to house a substrate for processing;

a energy source coupled to the chamber;

a system controller for controlling the introduction of a focused ion beam, having a diameter, from the energy source, a memory coupled to the controller comprising a computer-readable medium having a computer-readable program embodied therein for directing operation of the system, the computer-readable program comprising:

instructions for controlling the energy source to introduce the focused ion beam into the chamber and for controlling a spacing of pixels to which the focus ion beam is introduced.

19. The system of claim 18 further comprising:

a gas source coupled to the chamber;

wherein the system controller is further configured to control the introduction of a gas from the gas source into the chamber, and wherein the computer-readable program further comprises:

instructions for controlling the gas source and the energy source to introduce the focused ion beam and the gas into the chamber concurrently to interact with an exposed signal line comprising copper on the substrate.

20. The system of claim 18, wherein the instructions for controlling the pixel spacing further comprises further instructions to control etching of the exposed signal line.

21. The system of claim 18, wherein the source gas comprises an oxygen source gas.

22. The system of claim 18, wherein the pixel spacing is greater than the diameter of the focused ion beam.

23. The system of claim 18, wherein the pixel spacing is less than the diameter of the focused ion beam.

24. The system of claim 19, wherein the instructions control the introduction of the gas source and the introduction of the focused ion beam to introduce the gas source and the ion beam nonconcurrently.

25. A machine readable storage medium containing executable program instructions which when executed cause a digital processing system to perform a method comprising:

introducing a focused ion beam, having a diameter, to a metal material comprising copper on a substrate within a processing chamber; and patterning the metal material.

26. The machine readable medium of claim 25, wherein the patterning comprises patterning a pixel spacing that is greater than the diameter of the focused ion beam.

27. The machine readable medium of claim 25, wherein the pattern comprises a pixel spacing that is less than the diameter of the focused ion beam.

28. The machine readable medium of claim 26 further comprising introducing an interactive species to the metal material.

29. The machine readable medium of claim 27 further comprising introducing an interactive species to the metal material.

* * * * *